(12) United States Patent
Volant et al.

(10) Patent No.: US 7,355,271 B2
(45) Date of Patent: Apr. 8, 2008

(54) FLEXIBLE ASSEMBLY OF STACKED CHIPS

(75) Inventors: Richard P. Volant, New Fairfield, CT (US); Kevin S. Petrarca, Newburgh, NY (US); George F. Walker, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 130 days.

(21) Appl. No.: 10/573,561

(22) PCT Filed: Sep. 30, 2003

(86) PCT No.: PCT/US03/30640

§ 371 (c)(1),
(2), (4) Date: Mar. 27, 2006

(87) PCT Pub. No.: WO2005/041360

PCT Pub. Date: May 6, 2005

(65) Prior Publication Data

US 2007/0059951 A1 Mar. 15, 2007

(51) Int. Cl.
*H01L 23/02* (2006.01)
(52) U.S. Cl. ............... 257/686; 257/685; 257/E25.006; 257/E25.013; 257/E25.018; 257/E25.021; 257/E25.027; 257/E25.085; 257/E21.614; 438/109

(58) Field of Classification Search ............... 257/685, 257/686, 723, 777, E25.006, E25.013, E25.018, 257/E25.021, E25.027, E23.085, E21.614; 438/109, FOR. 426
See application file for complete search history.

(56) References Cited

U.S. PATENT DOCUMENTS

| 4,933,810 | A | 6/1990 | Cardashian et al. |
| 5,028,983 | A | 7/1991 | Bickford et al. |
| 5,198,965 | A | 3/1993 | Curtis et al. |
| 5,239,448 | A | 8/1993 | Perkins et al. |
| 6,677,670 | B2 * | 1/2004 | Kondo ........................ 257/686 |
| 6,867,496 | B1 * | 3/2005 | Hashimoto .................. 257/771 |
| 7,071,547 | B2 * | 7/2006 | Kang et al. ................. 257/686 |

* cited by examiner

Primary Examiner—Jasmine Clark
(74) Attorney, Agent, or Firm—H. Daniel Schnurmann

(57) ABSTRACT

A three-dimensional package consisting of a plurality of folded integrated circuit chips (100, 110, 120) is described wherein at least one chip provides interconnect pathways for electrical connection to additional chips of the stack, and at least one chip (130) is provided with additional interconnect wiring to a substrate (500), package or printed circuit board. Further described, is a method of providing a flexible arrangement of interconnected chips that are folded over into a three-dimensional arrangements to consume less aerial space when mounted on a substrate, second-level package or printed circuit board.

18 Claims, 8 Drawing Sheets

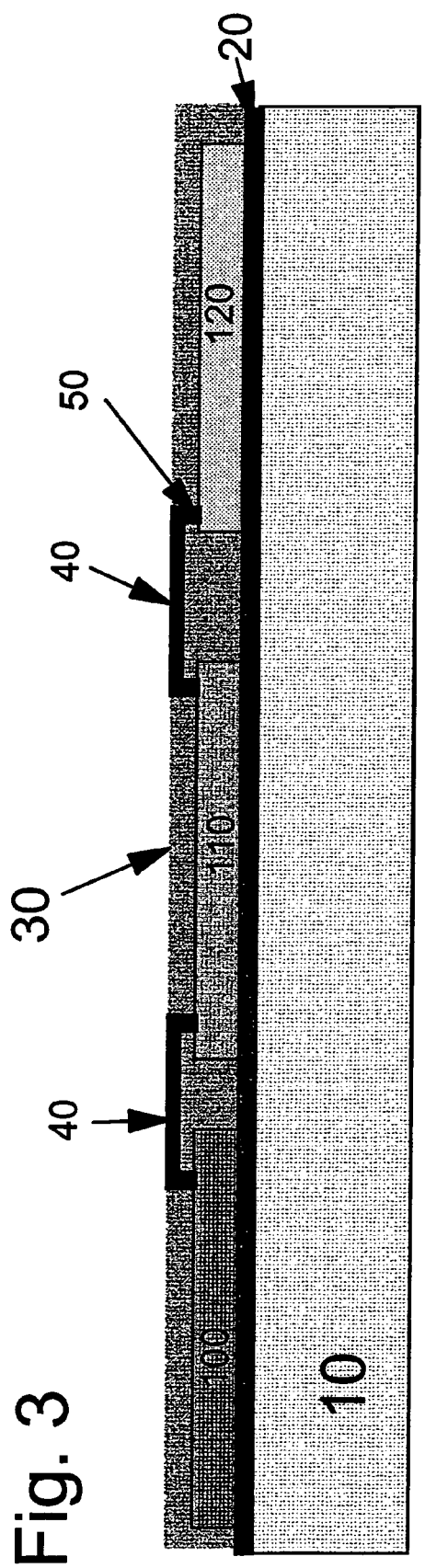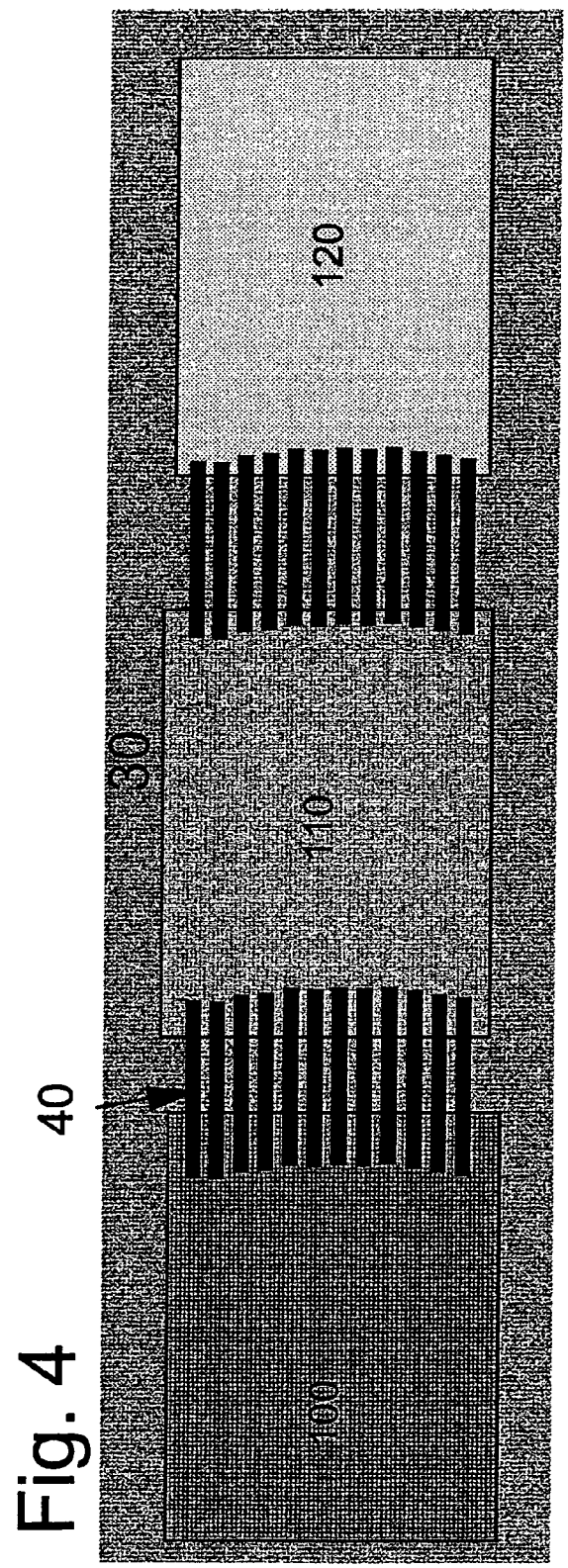

FLEXIBLE ASSEMBLY OF STACKED CHIPS

BACKGROUND OF THE INVENTION

The present invention relates generally to stacking chips and to an improved thermal extraction from the stacked chips structure and, more particularly, to interconnecting chips that electrically form a system-on-a-package (SOP) or which are attached to another SOP, while physically being folded into a three-dimensional arrangement which significantly reduces the footprint of the final assembly.

As systems become more complex, the need for integrated circuits with multiple functions increases, making it necessary to fabricate chips of different functions separately and assemble them into a system or a sub-system. By way of example, one may need to assemble the logic of a processor module, a memory chip and a wireless transceiver as a final product. Processing these chips does not allow building them concurrently on a single chip. It is therefore necessary to package each chip individually, and subsequently assemble the chips on a printed circuit board (PCB) that contains the electrical connections. The present example results in having three individual chips consuming valuable space on the PCB. It should also be noted that each chip generates waste heat, which must be extracted to keep the product running efficiently and reliably.

It is known in the art that the yield is generally much higher in packages consisting of smaller dies. It would therefore be highly advantageous to use multiple smaller dies, such that smaller high yield chips are interconnected to combine their respective functions in a single package.

Interconnections between packages are advantageously provided by flexible wires, as will be described hereinafter in the present invention, wherein the flexibility and strength of various metal/polymer combinations has already been demonstrated for a variety of applications such as, in the article "Adhesion Strength and Peeling Angle Measured on the Polyimide/Cr Interfaces" by Jin-Won Choi et al., published in the Proceedings of the 2000 Materials Research Society Symposium, Vol. 629, pp. FF5.10.1-FF10.1.10 by the Materials Research Society. The article describes the use of polyimide/Cr/Cu structures fabricated on BPDA-PDA polyimide, and the correlation between adhesion strength and peeling angle. It has been determined that without depending on the plastic bending of metal film or polyimide substrate, the adhesion strength increases with the peeling angle during T-peel tests.

In a paper on materials properties entitled "Maximizing Flex Life in Flexible Printed Circuits" published by the Rogers Corp. of Chandler, Ariz., web URL http://www.rogerscorporation.com, are described ways of maximizing the flex life of printed circuits by taking full advantage of the material's flexibility to conform to the packaging during fabrication.

In another publication "Adhesiveless Copper on Polyimide Substrate with Nickel-Chromium Tiecoat" by Tad Bergstresser et al. presented at the IPC Expo 2003 (web URL http://www.circuiTree.com/CDA/ArticleInformation/features/BNP_Features_Item/0,2133,100993,00.html) are discussed the characteristics of copper on polyimide substrates with nickel-chromium tiecoat. The peel strength after thermal aging, pressure cooker exposure, and exposure to gold plating are measured and compared to results for other tiecoat constructions. The NiCr tiecoat acts as a barrier between copper and polyimide and reduces adhesion loss after thermal aging as compared to no tiecoat. The NiCr tiecoat significantly improves adhesion retention after plating from neutral potassium gold cyanide bath. Its performance is comparable to samples with chromium tiecoat and better than samples with monel tiecoat. Peel loss after gold plating results from copper undercut, at the copper-polyimide interface, by components of the plating solution.

Typical stacked die applications require that the chips be thinned to a range of 50 to 125 μm. This results in special handling requirements as well as special tooling to deal with warpage. The typical stacked die arrangements also require high placement accuracy, as one chip is placed upon another which, otherwise, ends up with electrical failures. Other problems associated with stacked die applications include excessive epoxy covering bonding pads and special substrate design rules and loop heights for wire bonding have to be applied to prevent shorts. The present invention solves these and other problems while still providing many of the same benefits such as reduced space, weight savings and even enhanced performance.

OBJECTS AND SUMMARY OF THE INVENTION

Accordingly, the object of the invention is to provide for an electrically complete system or subsystem consisting of at least two chips folded into a three-dimensional arrangement.

It is further the object of the invention to provide a method for integrating a heat extraction element into the three-dimensional arrangement.

It is yet another object of the invention to provide an assembly consisting of a plurality of chips into a final package, PCB, or transposer wherein the plurality of chips are pre-connected, leaving at least one chip making contact to the package.

It is a further object of the invention to provide chips made of different substrate material and/or crystal orientation to be merged in a flexible chip arrangement.

It is still a further object of the invention to achieve increased yield as a function of smaller die or chips.

It is yet another object of the present invention to provide an arrangement of chips that maximizes the functional redundancy of whole or partial chips.

These and other objects of the invention are achieved by a three-dimensional flexible package consisting of a plurality of stacked chips, the package including at least two integrated circuit chips where at least one of them provides interconnect pathways for electrical connection to additional chips and at least one chip having additional interconnect wiring to an external package or PCB.

In one aspect of the invention, there is provided a flexible structure and a method of interconnecting chips that are folded over into a three-dimensional arrangement that consumes less aerial space when mounted on an external package or PCB. A thermally conductive membrane or conduit is folded into the assembly to provide a means for extracting waste heat.

The three-dimensional extended chip arrangement is attached to a silicon carrier or some other system-on-package (SOP) in order to significantly reduce the amount of SOP real estate utilized by each arrangement and to greatly extend the capabilities of the SOP. The stacked structure does not require excessive thinning of the substrates. Substrates of 200 to 300 um thickness can advantageously be used.

In another aspect of the invention, no requirement exists for vertical placement accuracy; only a typical x, y placement for forming the flexible interconnects, which is achieved with standard processing equipment. Wire bonding is performed at one level when wire bonding the flexible chip arrangement to the package. Unlike other stacked chip arrangements no special ground rules to prevent shorting of the multi-level loops are required.

BRIEF DESCRIPTION OF THE DRAWINGS

The accompanying drawings, which are incorporated in and which constitute a part of the specification, illustrate presently preferred embodiments of the invention and, together with the general description given above and the detailed description of the preferred embodiments given hereinafter serve to explain the principles of the invention.

FIGS. 1-3 illustrate a cross-sectional view showing the placement of individual die or chips onto a temporary carrier with a release layer. Also shown are the electrical interconnections formed by a flexible dielectric layer which also serves to physically attach the chips to one another while allowing folding of the chips over each other in various configurations FIG. 4 shows a planar view of the chips with the flexible dielectric of the aforementioned interconnections.

DETAILED DESCRIPTION OF THE INVENTION

Figure 1:
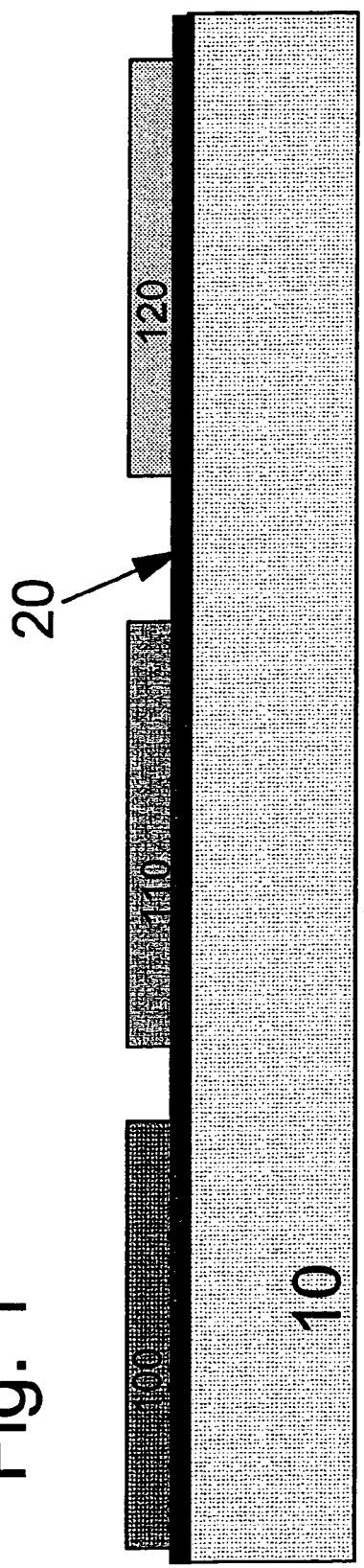

FIG. 1 illustrates a cross-sectional view of a temporary carrier 10 upon which a release layer 20 is deposited. The purpose of the release layer is to make it possible to attach thereon integrated circuit chips 100, 110, 120 and other constructs associated with the chips, the latter being separated from the temporary carrier at a later step. Preferably, the temporary chip carrier 10 is a transparent substrate such as quartz, boro-silicate or some like type material that can withstand BEOL process temperatures, although other materials can also be used, as it is well known to those skilled in the art. Release layer 20 is preferably a spin-on organic insulating layer, such as polyimide. The release process is described in U.S. Pat. No. 5,258,236, "Multi-layer Thin film Structure and Parallel Processing Method for Fabricating Same" to Arjavalingam et al. Chips 100, 110 and 120 may consist of any structure, device, or module, such as a fully integrated circuit or micro-electromechanical system (MEMS) interconnected to each other or attached to a common module.

Figure 2:
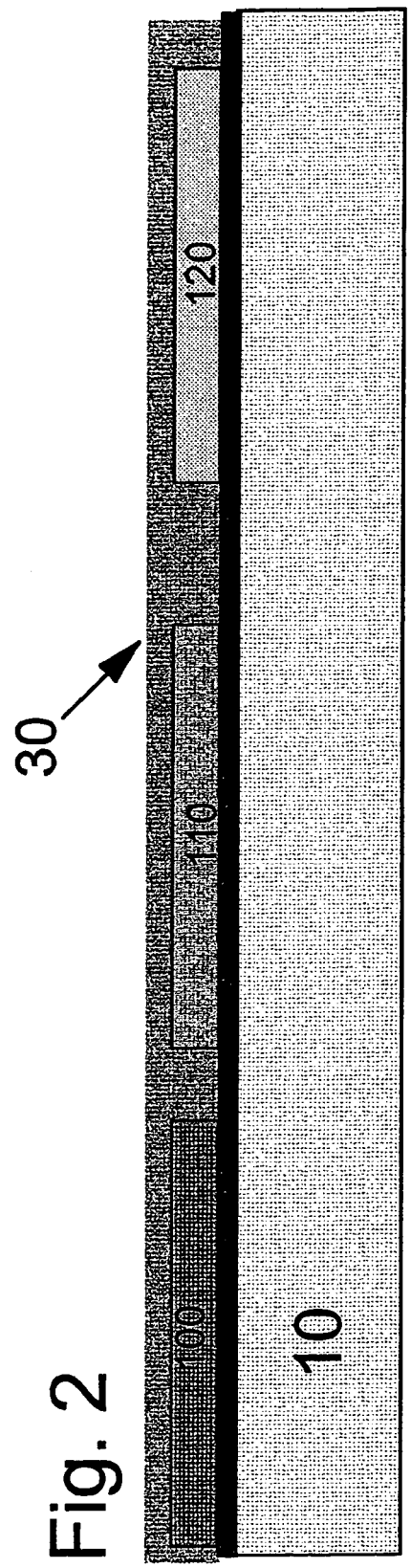

FIG. 2 shows the same cross-section of FIG. 1 having a dielectric layer 30 with a blanket deposition thereon. The dielectric material should preferably be flexible and have good dielectric properties. Examples of such material include polyimide or benzocyclobutene (BCB). The purpose of having layer 30 is to physically connect the various chips or modules 100, 110, 120, and to provide a medium for interconnections by way of conductive wires and the like to be formed therein. It also serves as a mechanical support for the final configuration of the assembly.

FIG. 3 illustrates the addition of interconnect lines 40 and studs (also referred hereinafter as vias) 50 placed in or on the flexible layer 30. The interconnections are preferably made of conductive material such as aluminum or copper, to provide adequate electrical connections between the individual chips 100, 110 and 120. The metal lines are preferably scaled to accommodate the necessary signals and power, as required. They are also shaped to provide optimum reliability with regards to the bending required to achieve folding the chips into their final assembly. Thus, it would be advantageous to construct the interconnections with a rectangular cross-section, aligning the radius of curvature to the thinner dimension. By way of example, the interconnections are constructed to be 30 μm wide but only 2 μm deep or thick. In this manner, they are more likely to bend easily while still having a large cross sectional area. Ideally, they are formed or bent only once during their final assembly.

FIG. 4 is a planar view of FIG. 3. Therein is illustrated in more detail the plurality of parallel interconnects 40 formed within the flexible layer 30, interconnecting the individual chips 100, 110 and 120.

Figure 5:
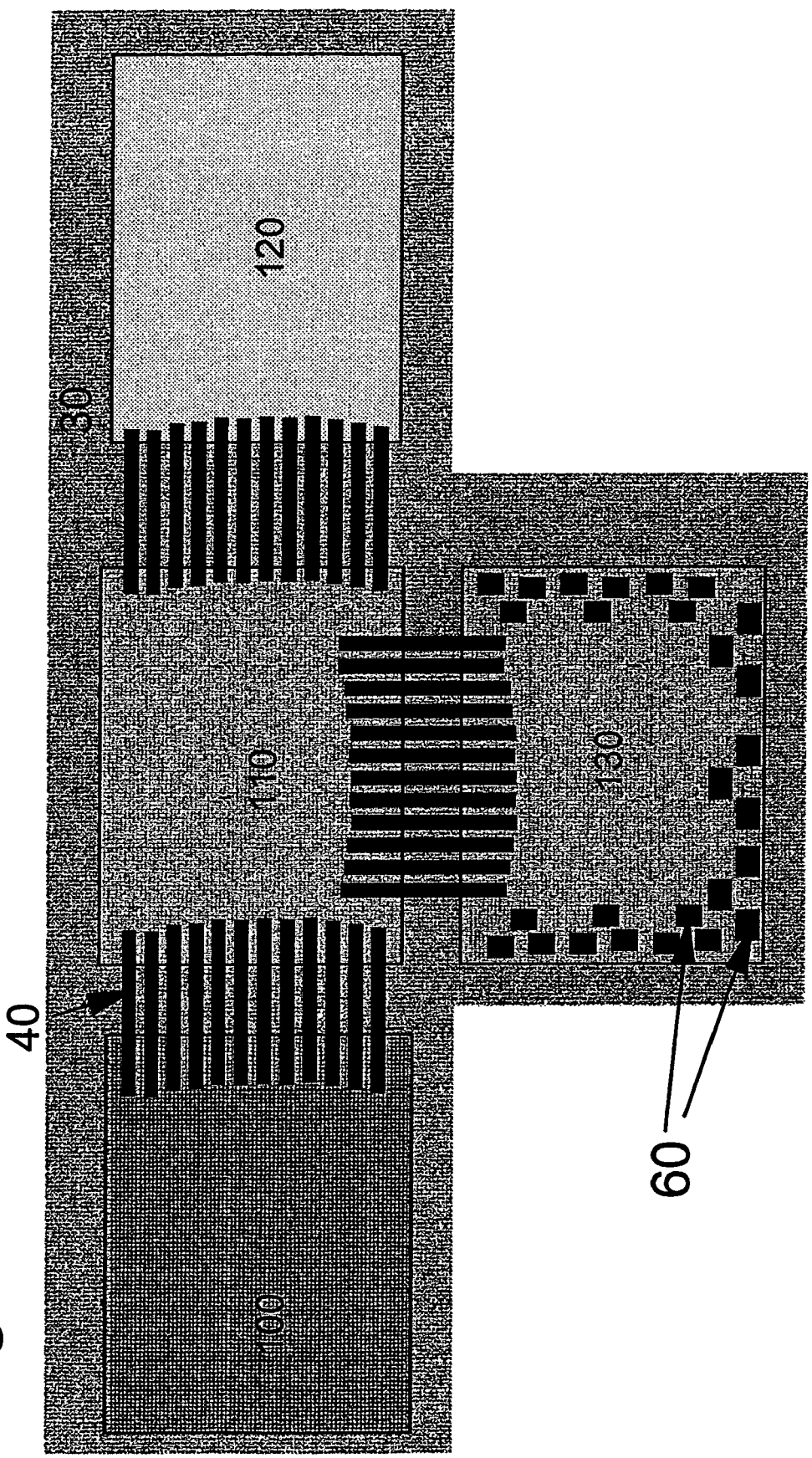
FIG. 5 shows the three-dimensional assembly with the addition of another chip serving as an interface to the final package, carrier, or PCB.

FIG. 5 illustrates a planar view of four chips 100, 110, 120 and 130 physically joined by the flexible dielectric layer 30 and electrically connected through the various interconnect wiring 40. Moreover, FIG. 5 shows chip 130 being provided with bonding pads 60 that are made available for connecting them to a carrier, package or any other means for providing an electrical connection to the final assembly.

Figure 6:
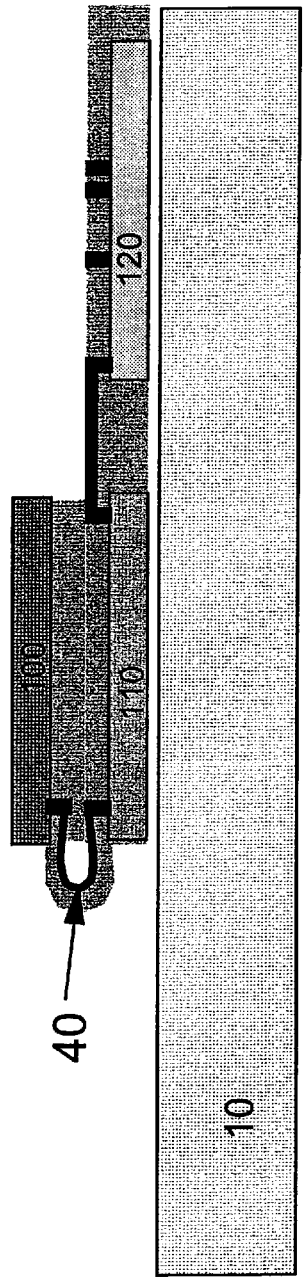
FIGS. 6 and 7 are cross-sectional views of the folded chips wherein an added thermal conduit snakes its way through the chip assembly.

FIG. 6 shows a cross-sectional view how the chips are released from carrier 10 by selectively removing release layer 20 to allow them to be folded over to form the stacked assembly.

In contrast with prior art three-dimensional assemblies, such as cube-memories wherein chips are stacked one on top of other in a rigid structure, with the chips always facing one direction, in the present invention, the chips are actually folded such that, for instance, the first chip 110 of the assembly will actually face the bottom of the second chip 100; the bottom of the third chip 120 of the assembly will face the top of the second 100, etc. Further, since interconnections are provided by way of discrete, flexible interconnections, the entire assembly is allowed a certain amount of movement between the chips. The length of interconnects 40 is determined partially by the order in which the chips are folded. By way of example, interconnects 40 linking chip 100 to chip 110 are, preferably, shorter that the ones linking chips 110 and 120. This is illustrated in FIG. 7 showing all three chips in a fully folded arrangement.

Figure 7:
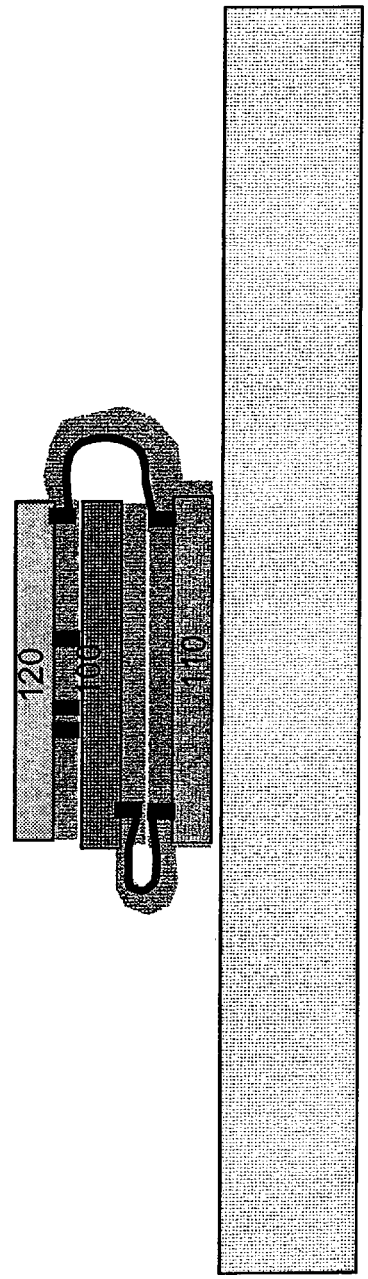
Figure 8:
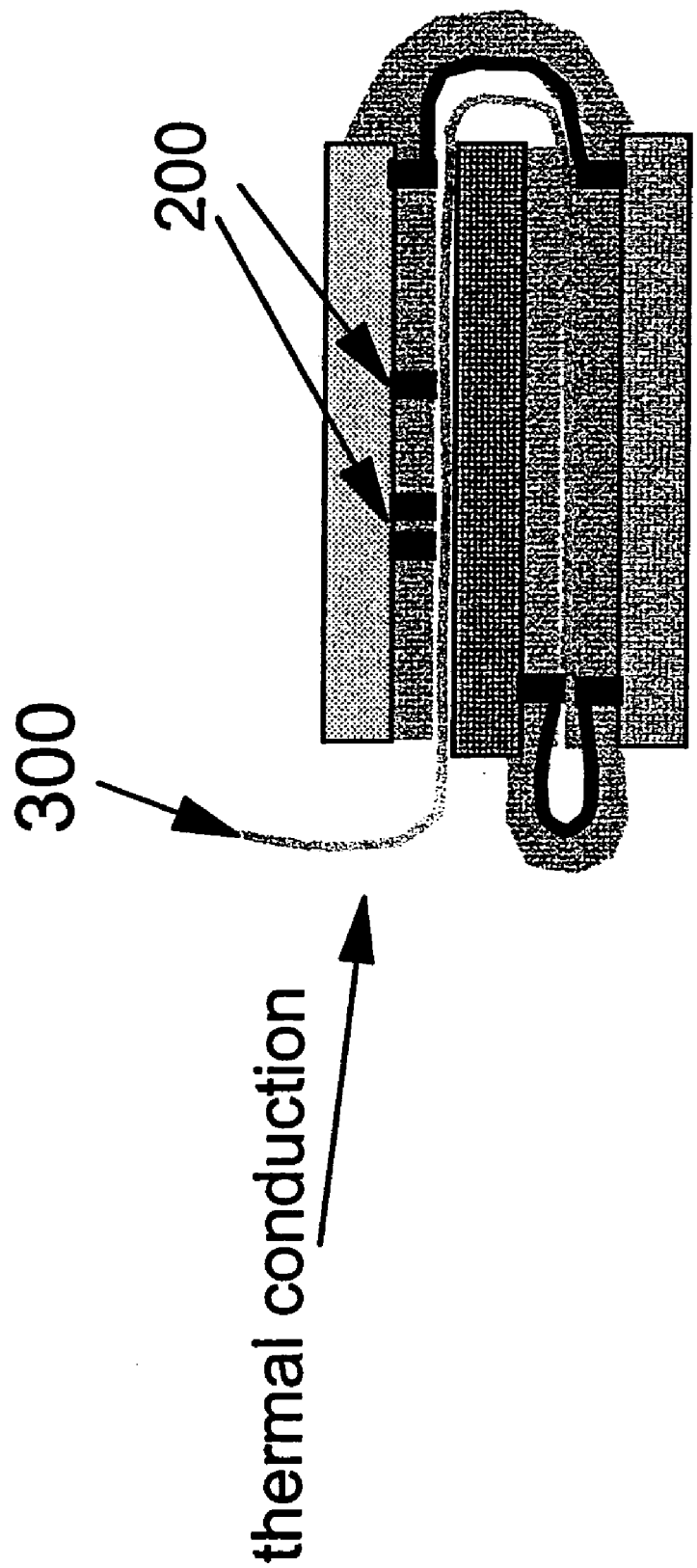
FIG. 8 is a cross-sectional view of a folded assembly with a heat transferring material incorporated into the package.

FIG. 8 illustrates a similar arrangement to the one shown in FIG. 7. Therein, is depicted the addition of a thermally conductive layer or pipeline 300, also referred to thermal sink, which is folded into the stack to provide an efficient means for extracting waste heat generated by the various chips. The thermal conductor 300 can be connected to a heat exchanger (not shown) external to the package. In addition, thermally conductive vias 200 may be incorporated into the interconnect level during the construction of the assembly to allow direct thermal contact between some interior sections of the chips-to the thermal sink layer 300.

Figure 9:
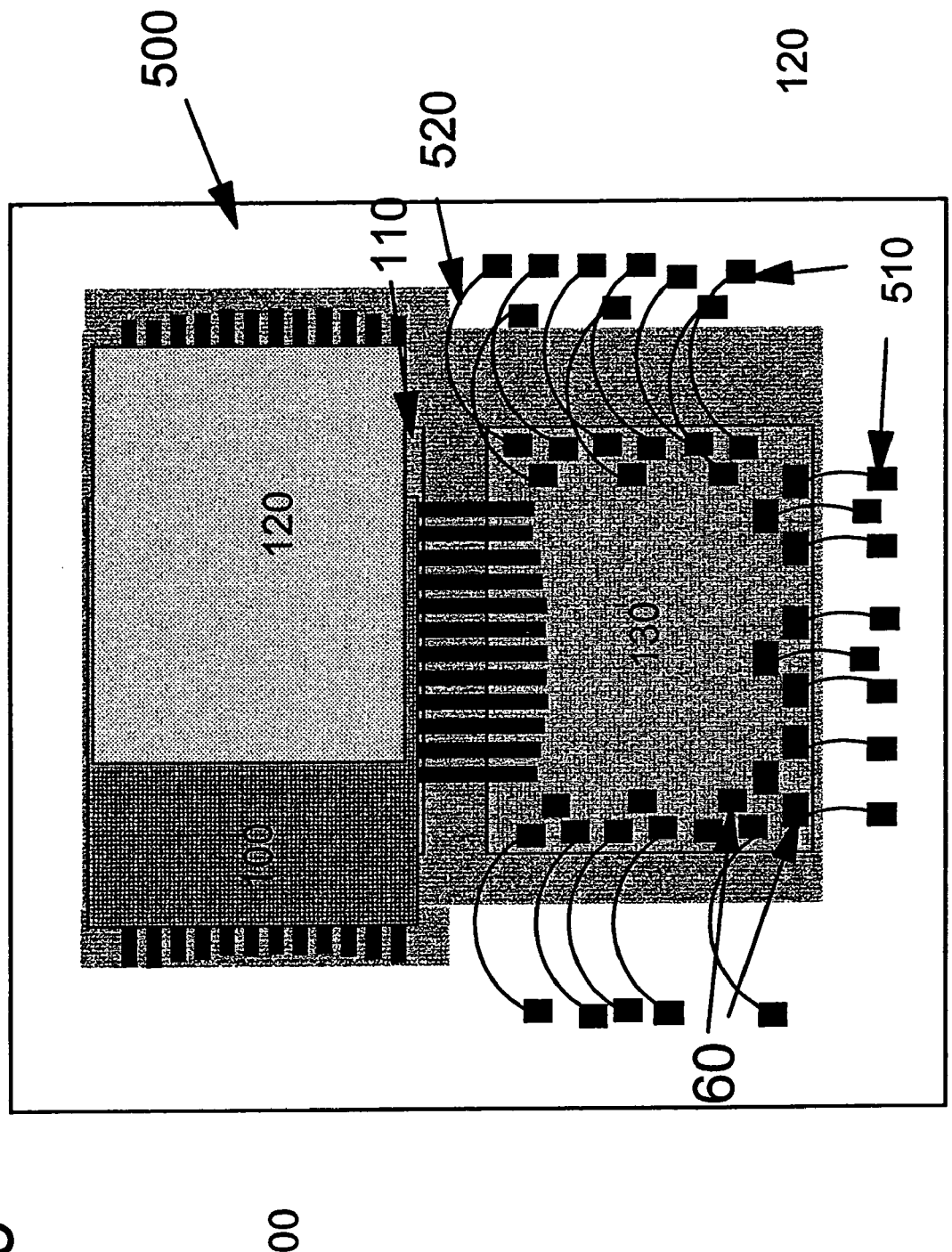
FIGS. 9 through 11 illustrate various embodiments showing how the assembly can be connected to the package, carrier or PCB.

FIG. 9 is a top-down view of the same structure as shown in FIG. 5 after successively folding chips 100 and 120 over 110. Additionally, FIG. 9 illustrates how the folded assembly may be wire-bonded to a carrier or package 500. Wire bond pads 60 along the periphery of chip 130 are connected by discrete wires 520 to the package 500 at pads 510, thereby providing the necessary interconnection to the second level package, i.e., silicon substrate 500. Practitioners of the art will recognize that substrate 500 is typically provided with various wiring planes to interconnect all the chips forming the various assemblies. The respective chips 130 of each stacked assembly are provided with their own distinctive footprints, which may vary from one assembly to the next.

Figure 10:
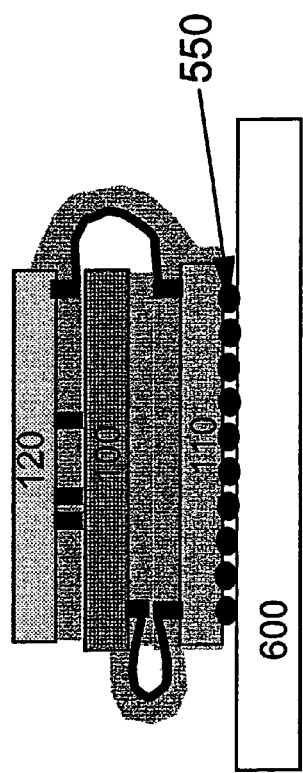
Figure 11:
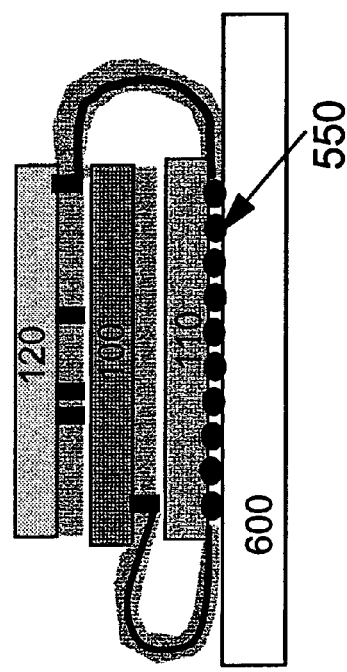

FIG. 10 illustrates an even more compact assembly that is made possible when the chip 110 is configured with a ball grid array (BGA) or C4's (Controlled Collapsible Chip Connectors, also referred as 'solder balls') interconnect system 550. This allows the stack to be directly bonded to carrier 600, eliminating the extra footprint of chip 130 shown in FIG. 9. In the present example, chip 110 is shown having through connections to the backside for the flexible interconnects. Chip 110 may be configured in a conventional manner wherein flexible interconnects are connected on the chip side as the BGA or C4 illustrated in FIG. 11.

Figure 12:
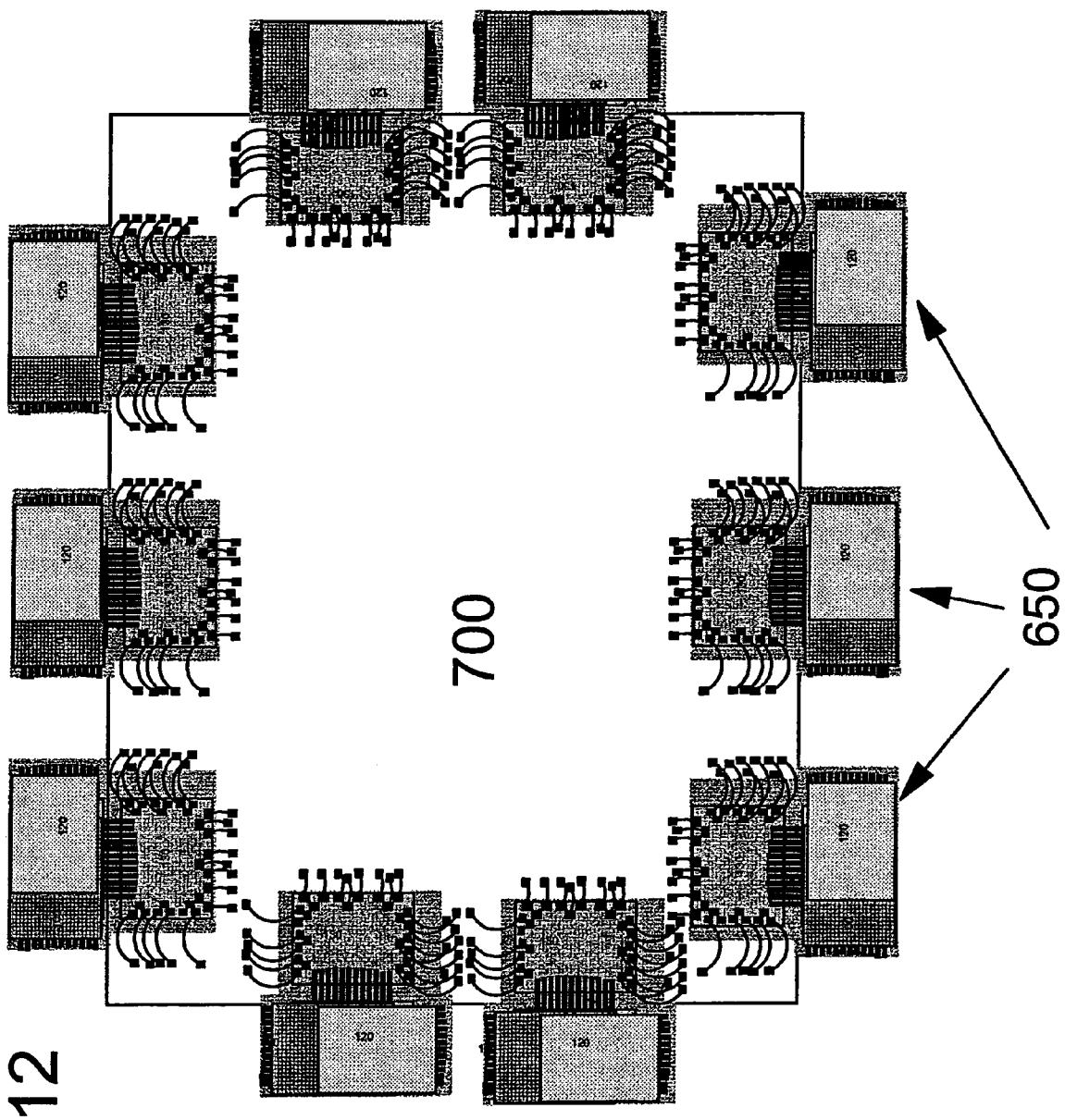
FIG. 12 illustrates a peripheral array of flexible folded multi-chip assemblies attached to a substrate or PCB.

FIG. 12 illustrates how the flexible chip arrangements 650 is used to extend the capabilities and reduce the amount aerial space required on a silicon carrier 700 or similar SOP device. This same concept can be executed using other joining methodology as previously mentioned. The SOP device may contain other chips, single or multiple levels of interconnect wiring and passive elements which require large amounts of real estate, such as inductors, transformers and capacitors. By combining the SOP with the flexible chips stacks one can greatly enhance the functionality of the overall system. This arrangement makes it possible to integrate a variety of chip functions and materials into a single package which would otherwise require multiple SOP or SOP like devices to be linked together. For clarity and to maintain focus on the objects of this invention, interconnects, passive devices and other elements of the carrier 700 are not shown.

Whereas many alterations and modifications of the present invention will no doubt be apparent to a person of ordinary skill in the art after having read the foregoing description, it is to be understood that the particular embodiments shown and described by way of illustration are in no way intended to be considered limiting. Therefore, reference to the detail of the preferred embodiment is not intended to limit the scope of the claims which themselves recite only those features regarded as essential to the invention.

The invention claimed is:

1. A flexible chip stacked chip assembly comprising:
   a plurality of chips (100, 110, 120) folded over one another and flexibly connected to one another by discrete insulated interconnects (40); and
   one chip (130) mounted on a chip carrier (500) flexibly connected to said plurality of folded chips (100, 110, 120) providing electrical connection between said plurality of stacked chips to pads (510) on said chip carrier (500).

2. The flexible chip stacked chip assembly recited in claim 1, wherein said discrete insulated interconnects are made of a conductive material selected from the group consisting of aluminum and copper.

3. The flexible chip stacked chip assembly recited in claim 1 wherein a length of said interconnects is determined by the order in which the chips are folded.

4. The flexible chip stacked chip assembly recited in claim 1 further comprising a thermal conduit folded into said plurality of folded stacked chips to provide means for extracting waste heat generated by said plurality of folded stacked chips.

5. The flexible chip stacked chip assembly recited in claim 4 wherein at least one chip makes physical connection to said thermal conduit.

6. The flexible chip stacked chip assembly recited in claim 1 wherein a bottom surface of the first chip of said assembly faces the bottom surface of the second chip of said assembly, while the bottom of the third chip faces the top of the second chip of said assembly.

7. The flexible chip stacked chip assembly recited in claim 1 wherein said plurality of chips (100, 110, 120) is arranged with the chips positioned substantially parallel with one another.

8. The flexible chip stacked chip assembly recited in claim 1 wherein said chip carrier (500) is selected from the group consisting of a silicon substrate, a system-on-package, a transposer, and a printed circuit board.

9. The flexible chip stacked chip assembly recited in claim 1 wherein said plurality of stacked chips is arranged in a non-parallel chip arrangement.

10. A flexible chip stacked chip assembly comprising:
    a plurality of chips (100, 110, 120) flexibly folded over one another and connected to one another by flexible discrete insulated interconnects (40), wherein the bottom most chip (110) is provided with a grid array of solder balls (550) making electrical contact between said plurality of stacked chips to pads on a chip carrier (600).

11. The flexible chip stacked chip assembly recited in claim 10 further comprising a thermal conduit snaking between said plurality of stacked chips.

12. The flexible chip stacked chip assembly recited in claim 11 wherein at least one chip of said plurality of stacked chips (100, 110, 120) makes physical connection to said thermal conduit.

13. An array of multi-chip assemblies comprising:
    a plurality of flexible stacked chip assemblies, each of said assemblies respectively comprising a plurality of chips (100, 110, 120) folded over one another and connected to one another by flexible discrete insulated interconnects, wherein at least one of said flexible chip assemblies is attached to a chip carrier (500).

14. The array of multi-chip assemblies recited in claim 13 wherein said chip carrier (500) is selected from the group consisting of a silicon substrate, a system-on-package (SOP), a multi-chip module and a transposer.

15. The array of multi-chip assemblies recited in claim 13 further comprising a thermal conduit folded within said plurality of folded stacked chips to provide means for extracting waste heat generated by said plurality of folded stacked chips.

16. A method of forming a flexible chip stacked chip assembly comprising the steps of:
    folding a plurality of chips (100, 110, 120) over one another, connecting one chip of said plurality of chips (100, 110, 120) to another by flexible discrete insulated interconnects (40); and
    mounting at least one chip on a chip carrier (500) electrically coupled to said plurality of folded chips to provide electrical connection between said plurality of stacked chips to pads (510) on said chip carrier (500).

17. A method of providing a flexible chip stacked chip assembly comprising the steps of:
    folding a plurality of chips (100, 110, 120) over one another, connecting one chip of said plurality of chips (100, 110, 120) to another by flexible discrete insulated interconnects, wherein the bottommost chip (110) of said plurality of chips (100, 110, 120) is provided with a grid array of solder balls making electrical contact between said plurality of stacked chips to pads (510) on a chip carrier (500).

18. A method of constructing an array of multi-chip assemblies comprising the steps of:

providing a plurality of flexible stacked chip assemblies, each of said assemblies respectively comprising a plurality of chips (100, 110, 120) folded over one another and connected to one another by flexible discrete insulated, wherein at least one of said one of said flexible chip assemblies is attached to a chip carrier (500).

* * * * *